United States Patent [19]

Briefer

[11] Patent Number: 4,949,054
[45] Date of Patent: Aug. 14, 1990

[54] TEMPERATURE STABLE OSCILLATOR

[75] Inventor: Dennis K. Briefer, Marlboro, Mass.

[73] Assignee: Setra Systems, Inc., Acton, Mass.

[21] Appl. No.: 235,673

[22] Filed: Aug. 24, 1988

[51] Int. Cl.$^5$ .......................... H03B 5/12; H03L 1/02
[52] U.S. Cl. ................................. 331/117 R; 331/65; 331/176
[58] Field of Search ........ 331/65, 66, 116 R, 116 FE, 331/116 M, 117 R, 117 FE, 117 D, 176

[56] References Cited

U.S. PATENT DOCUMENTS 4,603,308 7/1986 Briefer ..................... 331/176 X

Primary Examiner—David Mis
Attorney, Agent, or Firm—Lahive & Cockfield

[57] ABSTRACT

An oscillator including a first frequency control network having a series coupled inductance and sensor capacitor, a pair of cascaded capacitors, and an emitter follower amplifier coupled thereto. The emitter follower amplifier drives a current limiter and a feedback path, whereby the current through the emitter follower amplifier is divided between the current limiter and the feedback path in a manner establishing an oscillatory potential in the oscillator, while keeping the transistor of the emitter follower amplifier substantially out of its saturation state.

32 Claims, 2 Drawing Sheets

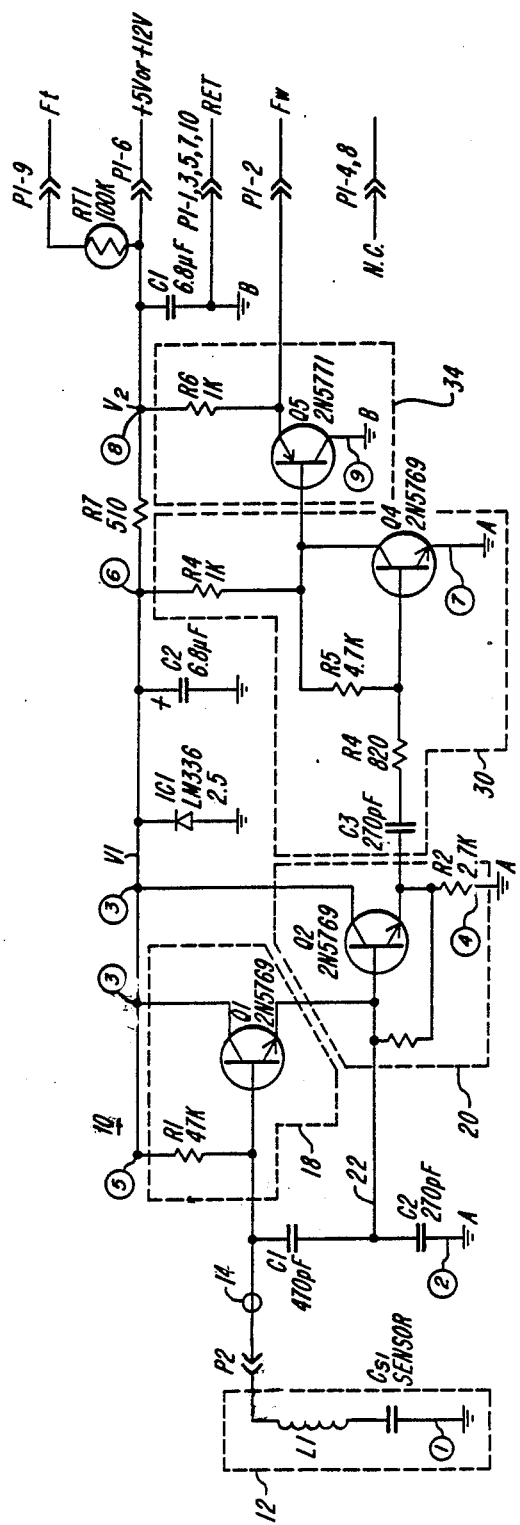
FIG. 1
FIG. 2

4,949,054

TEMPERATURE STABLE OSCILLATOR

BACKGROUND OF THE DISCLOSURE

Electronic oscillators having their frequency determined at least in part by a capacitance have been used in many applications. Certain of these applications require highly stable operation under conditions of varying temperature. For example, certain capacitance measuring circuits incorporate such oscillators where the capacitor-to-be-measured, or sensor capacitor, controls the frequency of oscillation. Where such circuits may be used over a varied temperature, it is important that circuits provide a signal representative the capacitance of the sensor capacitor, independent of temperature. One use of such an oscillator is a pressure transducer, where the sensor capacitor has a characteristic capacitance which varies with ambient pressure.

In the prior art, temperature-stable oscillators have been developed with complex, and correspondingly expensive, compensation networks which offset nominal oscillator frequency changes with temperature. Moreover, the required degree of temperature stability for an oscillator has been an extremely important factor in determining the oscillator cost.

U.S. Pat. No. 4,603,308 describes an oscillator which is highly temperature stable and also is relatively simple, and correspondingly inexpensive, compared with most of the other prior art. However, the oscillator disclosed in that patent includes a number of amplifiers and feedback networks that require a relatively large number of circuit components. Accordingly, even the highly temperature stable, and relatively simple, oscillator of the '308 patent, still is characterized by a significant complexity and corresponding cost.

In other forms of the prior art, relatively stable oscillators include, for example, a series L-C frequency control network coupled to a cascaded capacitance, and have a common base configuration transistor amplifier coupled to the cascade of capacitance in a manner establishing an oscillator signal at the collector of the transistor.

Accordingly, it is an object of the present invention to provide an improved oscillator.

Another object is to provide an improved oscillator characterized by a relatively high degree of temperature stability.

Yet another object is to provide an improved oscillator characterized by a relatively low cost and a relatively high degree of temperature stability.

BRIEF DESCRIPTION OF THE DRAWINGS

The foregoing and other objects of this invention, the various features thereof, as well as the invention itself, may be more fully understood from the following description, when read together with the accompanying drawings in which:

FIG. 1 shows, in schematic form, an exemplary embodiment of the present invention;

FIG. 2 shows an alternate form for the frequency control network of FIG. 1; and

SUMMARY OF THE INVENTION

Figure 3:
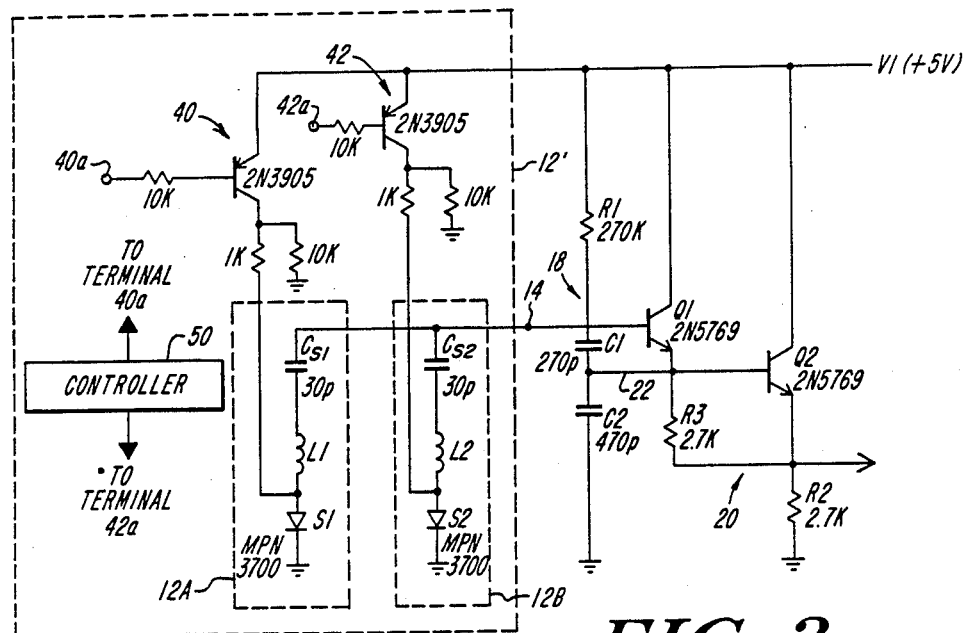
FIGS. 3 and 4 show, in schematic form, further embodiments of the invention.

Briefly, an oscillator in accordance with the present invention includes a first frequency control network having an inductance L1 and a sensor capacitor $C_{s1}$ coupled in series between a drive terminal and a first reference potential. Alternative frequency controllers, for example using a piezoelectric crystal, might also be used.

A pair of capacitors C1 and C2 are coupled in series between the drive terminal and a second reference potential. A first emitter follower amplifier is coupled to the drive terminal. That amplifier includes a transistor with its base connected to the drive terminal, its collector coupled to a third reference potential, and its emitter coupled by way of a current limiter to a fourth reference potential. Further, the amplifier includes a resistive current path between the base of the transistor and a fifth reference potential. In most applications, the first, second and fourth reference potentials are the same (for example, at ground potential), and the third and fifth reference potentials are the same, (for example, at a common supply potential).

The oscillator further includes a feedback path between the emitter and the junction between capacitors C1 and C2. That feedback path is effective so that current from the emitter of the emitter follower amplifier is divided between the current limiter and the feedback path in a manner establishing an oscillatory potential at the drive terminal and at the emitter of the transistor, while maintaining that transistor substantially out of its saturation state, that is the base-to-emitter voltage ($V_{BE}$) is less than the collector-to-emitter voltage ($V_{CE}$). Preferably, in part of each oscillation cycle, the transistor is in its cut-off state.

In one form of the invention, the oscillator further includes an output transistor amplifier which is coupled between two reference potentials that are different from the reference potentials coupled to the emitter follower amplifier. The output transistor amplifier is coupled to the emitter of the transistor of the first emitter follower amplifier. This configuration, where the reference potentials of the output amplifier are separate and distinct from those of the first emitter follower amplifier, an additional gain in stability is attained.

In various forms of the invention, the current limiter for the first emitter follower amplifier may take various forms. For example, the current limiter may include a second emitter follower amplifier having a transistor with its base connected to the emitter of the transistor of the first emitter follower amplifier, its collector connected to the third reference potential, and its emitter connected by way of a resistive current path to the fourth reference potential. Also, a resistive current path is established between the base of the transistor of the second emitter follower amplifier from the emitter of that amplifier.

Alternatively, the current limiter may be of the form of a resistive current path between the emitter of the first emitter follower amplifier and the fourth reference potential. As another alternative, an inductor and resistor in series Provide that current path.

Also, the frequency control network may have the form of a single inductor coupled in series with a single capacitor, or alternatively, may include a first inductive element $L_1$ having a terminal connected to a first terminal of the capacitor $C_{s1}$ and a second inductive element $L_2$ having a terminal connected to the second terminal of the capacitor $C_{s1}$. In the latter configuration, the effect of leakage capacitance is reduced. Alternatively, a piezoelectric frequency control element may be used in place of L1 and C1 to provide an extremely stable frequency of oscillation over a relatively broad range of supply voltages and temperatures.

The oscillator in accordance with the invention may also be configured to have a selectively controlled frequency of operation. In such configurations, the first frequency control network would include a two-state switch element coupled in series with the inductance L1 and the capacitance $C_{s1}$ between the drive terminal and first reference potential. In addition, one or more additional frequency control networks would be similarly configured. Switches in those frequency control networks are two-state switches which are substantially conductive in a first state and substantially non-conductive in a second state. A controller network may selectively control the state of the various switches of the frequency control networks to effect the coupling of one or more of those networks to the drive terminal. In some forms, only a single of the drive networks at a time may be coupled to the drive terminal.

In operation, the inductance and capacitance of the frequency control network controls the general frequency of operation of the oscillator. These may be selectively controlled by operating the switches in the respective frequency control networks. In one form, each switch may have the form of a series coupled diode and an associated drive network for selectively biasing the diode to be in its conductive state and its non-conductive state.

In additional forms of the invention, a basic oscillator including the first emitter follower amplifier may have a first output stage comprising a first output common emitter amplifier. That output common emitter amplifier includes a transistor having its base a.c. coupled to the emitter of a second emitter follower amplifier, its collector coupled by way of a resistive path to a sixth reference potential and its emitter coupled to a seventh reference potential. Preferably, the sixth reference potential is substantially equal to the third reference potential and the seventh reference potential is substantially equal to the fourth reference potential.

The oscillator may further include a third emitter follower amplifier which includes a transistor having its base coupled to the collector of the transistor of the common emitter amplifier, its emitter coupled by way of a resistive path to an eighth reference potential, and its collector coupled to a ninth reference potential, where each of the eighth and ninth reference potentials are different and distinct from the others of the reference potentials of the circuit.

In various forms of the invention, the transistor of the first emitter follower amplifier may be a NPN transistor and where the third reference potential is greater than the fourth reference potential. Alternatively, the transistor of that first emitter follower amplifier may be a PNP transistor and the third reference potential is less than the fourth reference potential.

DESCRIPTION OF THE PREFERRED EMBODIMENT

The present invention utilizes an emitter follower amplifier to provide the amplification and feedback for an oscillator incorporating a frequency control network coupled to a cascaded capacitance. With this configuration, the emitter follower amplifier of the present invention operates with a current sink to hold the oscillator to a low level, thereby substantially avoiding its saturation state. This configuration provides a highly stable (for example, one part per million per degree Centigrade) oscillation frequency by providing a relatively small phase shift through the amplifier. By avoiding the saturation state for the transistor in the emitter follower (i.e. by maintaining $V_{BE}$ to be less than $V_{CE}$), temperature stability is achieved because there is substantially no dependence on the saturation characteristics of the transistor, which may vary with temperature. Preferably, the transistor is in its cut-off state during part of each oscillatory cycle. Further, in the present invention, the oscillator with its current limiter-clipper may be decoupled from the output amplifier with a consequence that the output signal may be boosted while preventing reverse propagation through the network.

FIG. 1 shows, in schematic form, the preferred form of the present invention. In FIG. 1, the "first" through "ninth" reference potentials referred to in the Summary of the Invention set forth above are exemplified by the potentials at the nodes identified by correspondingly numbered and encircled reference designations.

FIG. 1 shows an oscillator 10, which includes a frequency control network 12. Network 12 includes an inductor L1 and a sensor capacitor $C_{s1}$ coupled between ground potential and a drive terminal 14. FIG. 2 shows an alternate form for network 12 in which the inductor L1 is split into discrete inductors L1 and L2 coupled on either side of capacitor $C_{s1}$. The latter configuration provides improved stability.

A pair of cascaded capacitors C1 and C2 are coupled in series between the drive terminal 14 and ground potential. A first emitter follower amplifier 18 includes a transistor Q1 having its base connected to the drive terminal 18, its collector coupled to a reference potential V1, and its emitter coupled by way of a current limiter 20 to ground potential. A resistor R1 provides a resistive current path between the base terminal of transistor Q1 and the potential V1.

A conductive path 22 is provided between the emitter of transistor Q1 and the junction between capacitors C1 and C2. This path 22 provides a feedback path which effectively divides current from the emitter of transistor Q1 between the current limiter 20 and the path 22 so that an oscillatory potential is established at the drive terminal and at the emitter of transistor Q1, while maintaining transistor Q1 substantially out of its saturation state.

In FIG. 1, the current limiter 20 has the form of second emitter follower amplifier. That second emitter follower amplifier includes a transistor Q2 with its base conductor connected to the emitter of transistor Q1, its collector connected to the reference potential V1, and its emitter connected by way of resistor R2 to ground potential. The emitter of transistor Q2 is also coupled by way of resistor R3 to the base of that transistor.

In alternate embodiments, the second emitter follower amplifier may be replaced by a relatively large resistor so that the emitter of transistor Q1 effectively sees a current limiter.

In a preferred form of the invention, the emitter of transistor Q2 is coupled to a first output common emitter amplifier 30. Amplifier 30 includes a transistor Q4 having its base a.c. coupled by capacitor C3 from the emitter terminal of transistor Q2. The collector of transistor Q4 is coupled to potential V1 by way of resistor R4. The emitter of transistor Q4 is coupled directly to ground potential. A feedback path between the collector of transistor Q4 and its base is provided by resistor R5. In the illustrated configuration, the ground potential for all elements described so far is a common ground potential.

A third emitter follower amplifier 34 includes a transistor Q5 having its base coupled to the collector of transistor Q4, its collector coupled to a ground potential, and its emitter coupled by way of a resistor R6 to a reference potential V2. In the amplifier 34, the ground potential to which the collector of transistor Q5 is connected is a separate and distinct ground potential from that which the other elements of elements 18, 20 and 30 are coupled. The potential V2 is isolated from the potential V1 by a resistor R7. By so isolating the ground potential of amplifier 34 and the potential V2 from the other reference potentials of the circuit, improved stability is attained.

In the preferred form of the invention, the potential V2 is 5 volts. In order to change the oscillator 10 to operate where V2 substantially equals 12 volts, the resistors R6 and R7 would be changed to each equal 2.7K ohms.

With this configuration, the oscillator 10 operates at a frequency in the range of 5 to 15 MHZ with stability on the order of one part per million per degree Centigrade over an operating temperature range of 0 to 100 degrees Centigrade.

Figure 4:
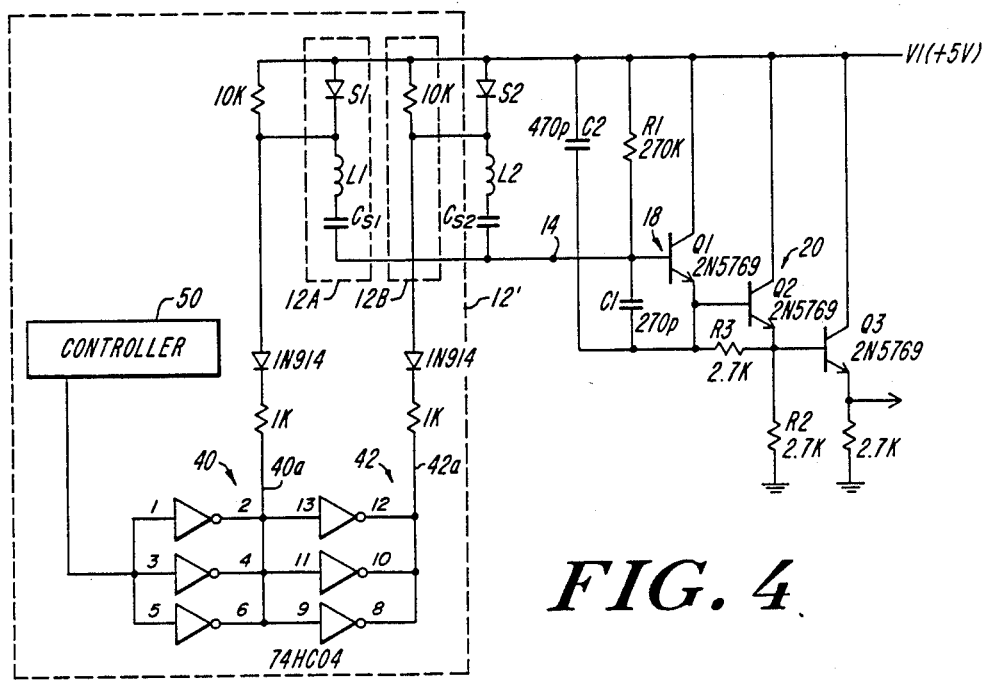

FIGS. 3 and 4 show alternate configurations of the present invention which are adapted for selectable frequency control. In the circuits in FIGS. 3 and 4, circuit elements which correspond to elements in FIG. 2 are identified with the same reference designations.

In FIG. 3, each of networks 12A and 12B of frequency control networks 12 includes a respective one of diode switches S1 and S2. The switches are coupled to biasing or gating networks 40 and 42, respectively. In operation, a signal applied to the inputs 40a and 42a of those respective bias networks can selectively control the state of the diode switches S1 and S2. Either or both of switches S1 and S2 may be in their conductive state. A controller 50 is indicated in FIGS. 3 and 4 to provide the respective control signals for those networks 40 and 42. In FIG. 4, the bias networks are coupled gates of a single integrated circuit which is arranged so that either network 12A or network 12B is operative at any given time, but not both. The operation of the oscillators of FIGS. 3 and 4 is similar to that of the oscillator in FIG. 2, except that the frequency of operation may be selectively controlled by the appropriate signals being applied to the control terminals 40a and 42a of the respective frequency control networks. While not shown, each of these may also have the output amplifiers with or without isolated ground potentials as shown in FIG. 2.

The selectable frequency input network 12 of the embodiments shown in FIGS. 3 and 4 may also be used in place of the frequency control network 12 of the embodiment of FIG. 1 to provide similar selectable frequency operation.

While the invention has been described for embodiments employing bipolar transistors, other active elements may be used as well. For example, each of bipolar transistors can be replaced by field effect transistors (FET's), where the gate of the FET replaces the base of the bipolar transistor, the source replaces the emitter and the drain replaces the collector.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An oscillator comprising:
    A. a first frequency control network coupled between a drive terminal and a first reference potential,
    B. a pair of capacitors C1 and C2 coupled in series between said drive terminal and second reference potential,
    C. a first emitter follower amplifier having a transistor with its base connected to said drive terminal, its collector coupled to a third reference potential, and its emitter coupled by way of a current limiter to a fourth reference potential, and having means for establishing a resistive current path between said base and a fifth reference potential,
    D. means for establishing a feedback path between said emitter and the junction between capacitors C1 and C2, whereby current from said emitter is divided between said current limiter and said feedback path to establish an oscillatory potential at said drive terminal and at said emitter while maintaininq said transistor substantially out of its saturation state.

2. An oscillator according to claim 1 wherein said frequency control network includes an inductance L1 and a sensor capacitor $C_{s1}$ in series.

3. An oscillator according to claim 1 wherein current limiter includes a second emitter follower amplifier having a transistor with its base connected to the emitter of said transistor of said first emitter follower amplifier, its collector connected to said third reference potential and its emitter connected by way of a resistive current path to said fourth reference potential and by way of a resistive current path to said base of said transistor of said second emitter follower amplifier.

4. An oscillator according to claim 1 wherein said current limiter includes a means for establishing a resistive current path between said emitter of said first emitter follower amplifier and said fourth reference potential.

5. An oscillator according to claim 1 wherein said current limiter includes a series connected resistor and inductor between said emitter of said first emitter follower amplifier and said fourth reference potential.

6. An oscillator according to claim 2 wherein said inductance L1 includes a first inductive element $L_1$ having a terminal connected to a first terminal of said capacitor $C_{s1}$ and a second element $L_2$ having a terminal connected to the second terminal of said capacitor $C_{s1}$.

7. An oscillator according to claim 2
    wherein said first frequency control network further includes a two state switch element S1 coupled in series with said inductance L1 and said capacitance $C_{s1}$ between said drive terminal and said first reference potential, said switch S1 being substantially conductive in its first state and being substantially non-conductive in its second state, and further comprising:
    a second frequency control network including an inductance L2 and a capacitor $C_{s2}$ and a two state switch element S2 coupled in series between said drive terminal and said first reference potential, said switch S2 being substantially conductive in its first state and being substantially non-conductive in its second state and further comprising:

a controller network including means for selectively controlling the state of said switch S1 and for selectively controlling the state in said switch S2.

8. An oscillator according to claim 7 wherein said controller includes means for controlling only one of said switches S1 and S2 to be in its first state at a time.

9. An oscillator according to claim 7 wherein said switch elements S1 and S2 each include a series coupled diode, and said controller includes a drive network coupled to each of said series coupled diode and including means for selectively biasing said diode into its conductive state and its non-conductive state.

10. An oscillator according to claim 1 wherein said third and fifth reference potentials are substantially equal and wherein said first, second, and fourth reference potentials are substantially equal.

11. An oscillator according to claim 1 wherein said transistor of said first emitter follower amplifier is an NPN transistor and said third reference potential is greater than said fourth reference potential.

12. An oscillator according to claim 1 wherein said transistor of said first emitter follower amplifier is a PNP transistor and said third reference potential is less than said fourth reference potential.

13. An oscillator according to claim 3 further comprising a first output common emitter amplifier including a transistor having its base a.c. coupled to said emitter of second emitter follower amplifier, its collector coupled by way of a resistive path to a sixth reference potential and its emitter coupled to a seventh reference potential.

14. An oscillator according to claim 13 wherein said fifth reference potential is substantially equal to said third reference potential, and said seventh reference potential is substantially equal to said fourth reference potential.

15. An oscillator according to claim 13 further comprising a third emitter follower amplifier including a transistor having its base coupled to the collector of the transistor of said common emitter amplifier, its emitter coupled by way of a resistive path to an eighth reference potential and its collector coupled to a ninth reference potential, said eighth and ninth reference potentials being different from each other and each of eighth and ninth reference potentials being different from the others of said reference potentials.

16. An oscillator according to claim 1 wherein said frequency control network includes a piezoelectric element.

17. An oscillator according to claim 1 further comprising an output amplifier having an input coupled to said emitter of said first emitter follower amplifier and having an output, said output amplifier having coupled to power supply reference potentials different than said first, second, third, fourth and fifth references potentials.

18. An oscillator comprising:
A. a first frequency control network coupled between a drive terminal and a first reference potential,
B. a pair of capacitors C1 and C2 coupled in series between said drive terminal and second reference potential,
C. a first source follower amplifier having a field effect transistor with its gate connected to said drive terminal, its drain coupled to a third reference potential, and its source coupled by way of a current limiter to a fourth reference potential, and having means for establishing a resistive current path between said gate and a fifth reference potential,
D. means for establishing a feedback path between said source and the junction between capacitors C1 and C2, whereby current from said source is divided between said current limiter and said feedback path to establish an oscillatory potential at said drive terminal and at said source while maintaining said transistor substantially out of its saturation state.

19. An oscillator according to claim 18 wherein said frequency control network includes an inductance L1 and a sensor capacitor $C_{s1}$ in series.

20. An oscillator according to claim 18 wherein current limiter includes a second source follower amplifier having a field effect transistor with its gate connected to the source of said transistor of said first source follower amplifier, its drain connected to said third reference potential and its source connected by way of a resistive current path to said fourth reference potential and by way of a resistive current path to said gate of said transistor of said second source follower amplifier.

21. An oscillator according to claim 18 wherein said current limiter includes a means for establishing a resistive current path between said source of said first source follower amplifier and said fourth reference potential.

22. An oscillator according to claim 18 wherein said current limiter includes a series connected resistor and inductor between said source of said first source follower amplifier and said fourth reference potential.

23. An oscillator according to claim 19 wherein said inductance L1 includes a first inductive element $L_1$ having a terminal connected to a first terminal of said capacitor $C_{s1}$ and a second element $L_2$ having a terminal connected to the second terminal of said capacitor $C_{s1}$.

24. An oscillator according to claim 18
wherein said first frequency control network further includes a two state switch element S1 coupled in series with said inductance L1 and said capacitance $C_{s1}$ between said drive terminal and said first reference potential, said switch S1 being substantially conductive in its first state and being substantially non-conductive in its second state, and further comprising:

a second frequency control network including an inductance L2 and a capacitor $C_{s2}$ and a two state switch element S2 coupled in series between said drive terminal and said first reference potential, said switch S2 being substantially conductive in its first state and being substantially non-conductive in its second state and further comprising:

a controller network including means for selectively controlling the state of said switch S1 and for selectively controlling the state in said switch S2.

25. An oscillator according to claim 24 wherein said controller includes means for controlling only one of said switches S1 and S2 to be in its first state at a time.

26. An oscillator according to claim 24 wherein said switch elements S1 and S2 each include a series coupled diode, and said controller includes a drive network coupled to each of said series coupled diode and including means for selectively biasing said diode into its conductive state and its non-conductive state.

27. An oscillator according to claim 18 wherein said third and fifth reference potentials are substantially equal and wherein said first, second, and fourth reference potentials are substantially equal.

28. An oscillator according to claim 20 further comprising a first output common source amplifier including a field effect transistor having its gate a.c. coupled to said source of second source follower amplifier, its drain coupled by way of a resistive path to a sixth reference potential and its source coupled to a seventh reference potential.

29. An oscillator according to claim 28 wherein said fifth reference potential is substantially equal to said third reference potential, and said seventh reference potential is substantially equal to said fourth reference potential.

30. An oscillator according to claim 28 further comprising a third source follower amplifier including a field effect transistor having its gate coupled to the drain of the transistor of said common source amplifier, its source coupled by way of a resistive path to an eighth reference potential and its drain coupled to a ninth reference potential, said eighth and ninth reference potentials being different from each other and each of eighth and ninth reference potentials being different from the others of said reference potentials.

31. An oscillator according to claim 18 wherein said frequency control network includes a piezoelectric element.

32. An oscillator according to claim 18 further comprising an output amplifier having an input coupled to said source of said first source follower amplifier and having an output, said output amplifier being coupled to power supply reference potentials different than said first, second, third, fourth and fifth reference potentials.

* * * * *